United States Patent
Haunsperger et al.

(10) Patent No.: US 11,930,611 B2
(45) Date of Patent: Mar. 12, 2024

(54) CONFIGURABLE CHASSIS SUPPORTING REPLACEABLE HARDWARE ACCELERATOR BASEBOARDS

(71) Applicant: Dell Products, L.P., Round Rock, TX (US)

(72) Inventors: Douglas Simon Haunsperger, Round Rock, TX (US); Walter R. Carver, Round Rock, TX (US); Bhavesh Govindbhai Patel, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/816,015

(22) Filed: Jul. 29, 2022

(65) Prior Publication Data
US 2024/0040733 A1 Feb. 1, 2024

(51) Int. Cl.
*H05K 7/14* (2006.01)
*G06F 13/40* (2006.01)

(52) U.S. Cl.
CPC ....... *H05K 7/1487* (2013.01); *G06F 13/4022* (2013.01); *G06F 2213/0026* (2013.01)

(58) Field of Classification Search
CPC .............. H05K 7/1487; G06F 13/4022; G06F 2213/0026
See application file for complete search history.

(56) References Cited

U.S. PATENT DOCUMENTS

| | | | |
|---|---|---|---|
| 10,956,346 B1 * | 3/2021 | Ben-Yehuda | G06F 13/4027 |
| 11,561,868 B1 * | 1/2023 | Poornachandran | G06F 11/202 |
| 2009/0089464 A1 * | 4/2009 | Lach | G06F 13/4022 710/62 |
| 2009/0216910 A1 * | 8/2009 | Duchesneau | H01B 3/24 709/250 |
| 2014/0047156 A1 * | 2/2014 | Billi | G06F 13/4022 710/314 |
| 2016/0232121 A1 * | 8/2016 | Castiel | G06F 13/4068 |
| 2017/0228339 A1 * | 8/2017 | Shao | G06F 13/4282 |
| 2019/0042801 A1 * | 2/2019 | Fender | G06F 1/324 |
| 2019/0347125 A1 * | 11/2019 | Sankaran | G06F 9/30087 |
| 2020/0356380 A1 * | 11/2020 | Kelly | G06F 11/3058 |
| 2022/0253394 A1 * | 8/2022 | Colenbrander | H04L 67/1097 |
| 2023/0051825 A1 * | 2/2023 | Chang | G06F 3/0635 |
| 2023/0126468 A1 * | 4/2023 | Bolen | G06F 13/4221 710/105 |

\* cited by examiner

Primary Examiner — Henry Tsai
Assistant Examiner — Aurangzeb Hassan
(74) Attorney, Agent, or Firm — Fogarty LLP

(57) ABSTRACT

Systems are provided where a chassis houses an Information Handling System (IHS). The chassis includes a motherboard with one or more CPUs configured to operate as a root complex for a PCIe switch fabric that includes a plurality of PCIe devices of the IHS. The chassis also includes an I/O module providing I/O capabilities for the motherboard. The I/O module includes a network controller configured to allocate network bandwidth for use by a hardware accelerator sled installed in the chassis, unless an integrated network controller is detected as a component of a hardware accelerator baseboard installed in the hardware accelerator sled. The I/O module also includes a PCI switch configured to operate with the CPUs as the root complex of the PCIe switch fabric and further configured to operate with the hardware accelerator baseboard as the root complex of the PCIe switch fabric.

20 Claims, 6 Drawing Sheets

CONFIGURABLE CHASSIS SUPPORTING REPLACEABLE HARDWARE ACCELERATOR BASEBOARDS

FIELD

The present disclosure relates generally to Information Handling Systems (IHSs), and relates more particularly to supporting replaceable hardware accelerators with varying capabilities within a chassis housing one or more IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers, that are installed within chassis and stacked within slots provided by racks. A data center may include large numbers of such racks that may be organized into rows in a manner that allows administrators to access components of the IHSs via the front and the back of a rack. In some instances, administrators may be able to service and replace components of a rack-mounted IHS while the IHS remains operational and installed within the rack. Such replaceable components may be referred to as being hot-pluggable. An administrator may also be able to re-configure aspects of the operation of a rack-mounted IHS through the coupling and de-coupling of cables to the various connectors that may be provided on the back of a chassis or by a rear-facing chassis component. In some instances, administrators may remove an IHS from operation in order to service or replace some of its internal components.

In many instances, rack systems are constructed according to standardized dimensions that define vertical and horizontal dimensions for components, such as chassis housing one or more server IHSs, that are installed within such racks. Standardized rack dimensions specify vertical units of space within a rack, where such vertical units of rack space are commonly referred to as RUs (Rack Units). In some instances, a chassis may be one rack unit (1 RU) in height and may house a single IHS. In other instances, a chassis be multiple rack units in height and the chassis may include multiple IHSs. For example, a 2 RU chassis may include a set of front bays that receive replaceable storage drives and may house two server IHSs that are each 1 RU in height. In such instances, each of the 1 RU IHSs may be separately administered and may themselves be replaceable components that may be coupled and de-coupled from a chassis. In this manner, the capabilities of a chassis may be reconfigured though the additional, removal or replacement of hardware components that are installed in the chassis.

SUMMARY

In various embodiments, chassis are provided that house an Information Handling System (IHS). The chassis may include: a motherboard comprising one or more CPUs (Central Processing Units) configured to operate as a root complex for a PCIe switch fabric comprising a plurality of PCIe devices of the IHS; and an I/O module providing I/O capabilities for the motherboard, wherein the I/O module comprises: a network controller configured to allocate network bandwidth for use by a hardware accelerator sled installed in the chassis, unless an integrated network controller is detected as a component of a hardware accelerator baseboard installed in the hardware accelerator sled, and a PCI switch configured to operate with the CPUs as the root complex of the PCIe switch fabric and further configured to operate with the hardware accelerator baseboard as the root complex of the PCIe switch fabric.

Some chassis embodiments may further include, a 2 RU (Rack Unit) control layer, wherein the control layer comprises: the motherboard; and a power supply for use by components installed in the control layer of the chassis and for use by components installed in a 4 RU processing layer of the chassis. Some chassis embodiments may further include the processing layer, wherein the processing layer comprises: the I/O module and the hardware accelerator baseboard. In some chassis embodiments, a height of the chassis is 6 RU. In some chassis embodiments, the I/O module is replaceable via a front compartment of the processing layer of the chassis. In some chassis embodiments, the hardware accelerator sled installed in a bay of the chassis, where the hardware accelerator sled comprises the hardware accelerator baseboard. In some chassis embodiments, the hardware accelerator sled comprises a plurality of GPU (Graphics Processing Unit) baseboards and wherein the hardware accelerator baseboard comprises a first of the GPU baseboards. In some chassis embodiments, the plurality of PCIe devices comprise a plurality of SSDs (Solid State Drives). In some chassis embodiments, the CPUs are the root complex of the PCIe switch fabric, DMA (Direct Memory Access) on the SSDs is provided by the PCIe switch of the I/O module. In some chassis embodiments, when the hardware accelerator baseboard is the root complex of the PCIe switch fabric, DMA on the SSDs is provided by a PCIe switch of the hardware accelerator baseboard.

In various additional embodiments, Information Handling Systems (IHSs) are installed in a chassis and the IHSs may include: a motherboard comprising one or more CPUs (Central Processing Units) configured to operate as a root complex for a PCIe switch fabric comprising a plurality of PCIe devices of the IHS; and an I/O module providing I/O capabilities for the motherboard, wherein the I/O module comprises: a network controller configured to allocate network bandwidth for use by a hardware accelerator sled installed in the chassis, unless an integrated network controller is detected as a component of a hardware accelerator baseboard installed in the hardware accelerator sled, and a PCI switch configured to operate with the CPUs as the root complex of the PCIe switch fabric and further configured to operate with the hardware accelerator baseboard as the root complex of the PCIe switch fabric.

In some IHS embodiments, the I/O module is replaceable via a front compartment of the processing layer of the chassis. In some IHS embodiments, the hardware accelerator sled installed in a bay of the chassis, where the hardware accelerator sled comprises the hardware accelerator baseboard. In some IHS embodiments, the hardware accelerator sled comprises a plurality of GPU (Graphics Processing Unit) baseboards and wherein the hardware accelerator baseboard comprises a first of the GPU baseboards. In some IHS embodiments, the plurality of PCIe devices comprise a plurality of SSDs (Solid State Drives).

In various additional embodiments, systems may include: a motherboard comprising one or more CPUs (Central Processing Units) configured to operate as a root complex for a PCIe switch fabric comprising a plurality of PCIe devices of the IHS; and an I/O module providing I/O capabilities for the motherboard, wherein the I/O module comprises: a network controller configured to allocate network bandwidth for use by a hardware accelerator sled installed in the chassis, unless an integrated network controller is detected as a component of a hardware accelerator baseboard installed in the hardware accelerator sled, and a PCI switch configured to operate with the CPUs as the root complex of the PCIe switch fabric and further configured to operate with the hardware accelerator baseboard as the root complex of the PCIe switch fabric.

In some system embodiments, the I/O module is replaceable via a front compartment of the processing layer of the chassis. In some system embodiments, the hardware accelerator sled installed in a bay of the chassis, where the hardware accelerator sled comprises the hardware accelerator baseboard. In some system embodiments, the hardware accelerator sled comprises a plurality of GPU (Graphics Processing Unit) baseboards and wherein the hardware accelerator baseboard comprises a first of the GPU baseboards. In some system embodiments, the plurality of PCIe devices comprise a plurality of SSDs (Solid State Drives).

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

As described, in a data center environment, an IHS may be installed within a chassis, in some cases along with other similar IHSs, such as other server IHSs. A rack may house multiple such chassis and a data center may house numerous racks. Each rack may host a relatively large number of IHSs that are installed as components of chassis, with multiple chassis stacked and installed within each rack. In certain instances, the front-side of such rack-mounted chassis may include one or more bays that each receive an individual replaceable component, such as a storage drive or a computing node. In some instances, these components may be removeable components that may be inserted and extracted from rear-facing bays of the chassis. In some cases, these components may be hot-swappable components that may be removed and replaced by administrators while at least a portion of the IHS remains operational. In other cases, an IHS is removed from service while an administrator removes a chassis from a rack in order to add, remove or replace hardware components of the chassis. In some instances, such servicing of a chassis results in modifications to capabilities of the chassis. It is preferable that a chassis support multiple different configurations of internal components, thus reducing the number of different chassis that must be maintained and supported within a data center.

Figure 1:
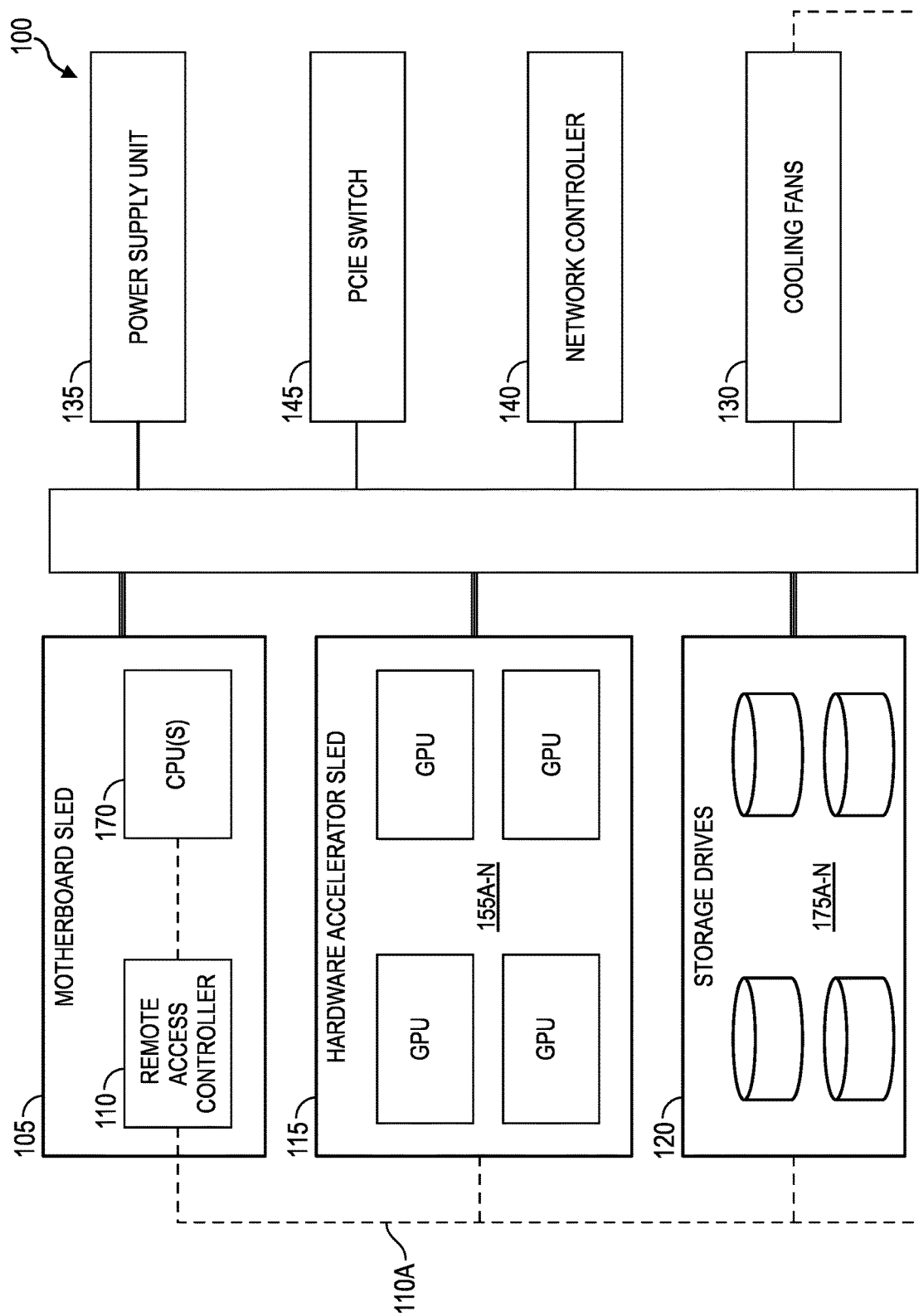
FIG. 1 is a diagram illustrating certain components of a chassis, according to embodiments, that may be reconfigured using an I/O module that supports use of replaceable hardware accelerator baseboards within the chassis.

FIG. 1 is a diagram illustrating certain components of a chassis 100, according to embodiments, that may be reconfigured using an I/O module that supports use of replaceable hardware accelerator baseboards within the chassis 100. Embodiments of chassis 100 may include a wide variety of hardware configurations. Such variations in hardware configuration may result from chassis 100 being factory assembled to include components specified by a customer that has contracted for manufacture and delivery of chassis 100. Upon delivery and deployment of a chassis 100, the chassis 100 may be modified by replacing and/or adding various hardware components, in addition to replacement of the removeable IHSs components installed in the chassis.

Chassis 100 may include one or more bays that each receive an individual sled (that may be additionally or alternatively referred to as a tray, blade, and/or node), such as motherboard sled 105 and hardware accelerator sled 115. Chassis 100 may support a variety of different numbers (e.g., 4, 8, 16, 32), sizes (e.g., single-width, double-width) and physical configurations of bays. Embodiments may include additional types of sleds that provide various storage, power and/or processing capabilities. For instance, sleds installable in chassis 100 may be dedicated to providing power management or networking functions. Sleds may be individually installed and removed from the chassis 100, thus allowing the computing and storage capabilities of a chassis to be reconfigured by swapping the sleds with different types of sleds, in some cases at runtime without disrupting the ongoing operations of the other sleds installed in the chassis 100. The sleds may be individually coupled to chassis 100 via connectors that correspond to the bays provided by the chassis 100 and that physically and electrically couple the sleds to motherboard sled 105 and/or to one another.

Multiple chassis 100 may be housed within a rack. Data centers may utilize large numbers of racks, with various different types of chassis installed in various configurations of racks. The modular architecture provided by the sleds, chassis and racks allow for certain resources, such as cooling, power and network bandwidth, to be shared by the sleds installed in chassis 100, thus providing efficiency improvements and supporting greater computational loads.

Chassis 100 may be installed within a rack structure that provides a portion of the cooling utilized by the sleds installed in chassis 100. For airflow cooling, a rack may include one or more banks of cooling fans that may be operated to ventilate heated air from within the chassis 100 that is housed within the rack. As described in additional detail below, chassis 100 may alternatively or additionally include a bank of cooling fans 130 that may be similarly operated to ventilate heated air out of the chassis and away from the sleds installed within chassis. In this manner, a rack and a chassis 100 installed within the rack may utilize various configurations and combinations of cooling fans to cool the sleds and other components housed within chassis 100.

As described in additional detail below, motherboard sled 105 may implemented in embodiments such that it may be installed within a 2 RU bay of chassis 100, thus supporting a high-density configuration of chassis 100 where a replaceable hardware accelerator sled 115 may be installed within a 6 RU bay of chassis 100. Motherboard sled 105 may include be a printed circuit board (i.e., motherboard) that includes electrical traces and connectors that are configured to route signals between the various components of chassis 100 that are connected to the motherboard sled 105 and between different components mounted on the motherboard. As illustrated, motherboard sled 105 may include one or more CPU(s) used to execute software programs that include an operating system and that may also include various programs for utilizing and managing the capabilities provided by chassis 100, and in particular by hardware accelerator sled 115.

In some embodiments, motherboard sled 105 may be an IHS such as described with regard to IHS 200 of FIG. 2. Accordingly, motherboard sled 105 may include a variety of processing and data storage components. Utilizing these capabilities, motherboard sled 105 may implement a variety of management and security operations for the components of chassis 100. Motherboard sled 105 may also include various I/O controllers that may support various I/O ports, such as USB ports that may be used to support keyboard and mouse inputs and/or video display capabilities. Such I/O controllers may be utilized to support various KVM (Keyboard, Video and Mouse) capabilities that provide administrators with the ability to interface with the chassis 100. Motherboard sled 105 may support various additional functions for use of resources of chassis 100, such as for the use of computational resources provided by hardware accelerator sled 115. In some scenarios, motherboard sled 105 may implement tools for managing various other resources available via chassis 100, such as power outputs of power supply unit 135, the network bandwidth provided by network controller 140 and/or PCIe switch 145, and the airflow cooling provided by cooling fans 130.

Motherboard sled 105 may be coupled to PCIe-compliant components of chassis 100 via a PCIe switch fabric that may include PCIe switch 145, network controller 140, some or all of the storage drives 120 and the hardware accelerator sled 115. In some embodiments, the connectors for use in coupling motherboard sled 105 to a PCIe switch 145 include PCIe couplings that support configurable, high-speed data links, where these PCIe links may connect the CPUs 170 of motherboard sled 105 to hardware accelerator sled 115, network controller 140 and some or all of storage drives 120.

As described in additional detail below, this PCIe switch fabric may be implemented using a PCIe switch 145 that is a component of an I/O module installed within a front compartment of a 4 RU processing layer of chassis 100. In such configurations of chassis 100, the root complex of the PCIe switch fabric is implemented by the CPU 170 of the motherboard sled 105. However, in some instances, chassis 100 may instead be configured with a hardware accelerator sled 115 that includes integrated I/O capabilities. In instances where these integrated I/O capabilities of the hardware accelerator sled 115 include a network controller and a PCIe switch, embodiments support the root complex of PCIe switch fabric being operated by the hardware accelerator sled 115, thus enabling high-speed memory operations directly by the hardware accelerator sled 115 without relying on the CPUs 170 of the motherboard sled 105. Regardless of whether the PCIe root complex is implemented by the CPU 170 of the motherboard sled 105 or by the hardware accelerator sled 115, embodiments utilize an I/O module installed within chassis 100, that is capable of supporting I/O capabilities for chassis 100 in either of these PCIe root complex configurations.

As illustrated, motherboard sled 105 includes a remote access controller (RAC) 110. As described in additional detail with regard to FIG. 2, remote access controller 110 provides capabilities for remote monitoring and management of the components installed in chassis 100. In support of these monitoring and management functions, remote access controllers 110 may utilize both in-band and sideband (i.e., out-of-band) 110a communications with various components of chassis 100. Remote access controllers 110 may collect various types of sensor data, such as collecting temperature sensor readings that are used in support of airflow cooling of the chassis 100 and of the motherboard sled 105. In addition, remote access controller 110 may implement various monitoring and administrative functions related to motherboard sled 105 that utilize sideband bus connections with various internal components of the motherboard sled 105. In some embodiments, remote access controller 110 may detect capabilities of the hardware accelerator sled 115 that has been coupled to the chassis 100, and in particular, may detect wither the remote access controller 110 includes integrated I/O capabilities.

Chassis 100 also includes a replaceable hardware accelerator sled 115 that includes one or more processing cores that may be used for delegating a variety of processing tasks, where such delegation may be through programs operating on motherboard sled 105, or via remote systems that interface with the hardware accelerator sled 115 via connections supported by network controller 140. In some embodiments, the processing cores may include multiple GPUs (Graphics Processing Units) 155a-n that may be configured for use in high-performance computing applications. In some embodiments, hardware accelerator sled 115 may include one or more hardware accelerator baseboards, where each accelerator baseboards may itself include one or more accelerator cores. Accordingly, GPUs 155a-n may each represents separate hardware accelerator baseboard that may include multiple GPU cores. In some embodiments, some or all of the accelerator cores available in hardware accelerator sled 115 may be programmable processing cores that can be configured for offloading specific computational functions to the hardware accelerator sled 115.

Hardware accelerator sled 115 may be configured for general-purpose computing or may be optimized for specific computing tasks, such as for implementing machine learning or other artificial intelligence systems. In various embodiments, hardware accelerator sled 115 provides high-performance, computational processing resources that may be used to support a variety of e-commerce, multimedia, entertainment, business and scientific computing applications. Accordingly, hardware accelerator sled 115 may be typically configured with hardware and software that provide leading-edge computational capabilities.

In some scenarios, the capabilities of a chassis 100 may reconfigured through administration of the hardware accelerator sled 115. For example, the hardware accelerator baseboards that are installed within the hardware accelerator sled 115 may be added, removed or replaced by an administrator. Alternatively, an entirely different hardware accelerator sled 115 with different the accelerator baseboards may be installed in chassis 100. In some instances, the reconfiguration or replacement of hardware accelerator sled 115 results in installation of a hardware accelerator baseboard that includes integrated I/O capabilities, such as an integrated PCIe switch 145 and an integrated network controller 140. As described in additional detail below, embodiments support the ability for such reconfiguration of chassis 100, such that the described components of chassis 100 support a PCIe root complex that is operated by the CPU(s) of the motherboard sled 105, or that is instead operated by a hardware accelerator baseboard installed in a hardware accelerator sled 115.

As illustrated, chassis 100 also includes one or more storage drives 120 that may be attached to chassis and coupled to connectors supported by components of chassis 100, such as by PCIe switch 145. For instance, storage drives 120 may include multiple solid-state drives (SSDs) 175a-n that are accessed by components of chassis 100 via PCIe switch 145, thus providing low-latency and high-bandwidth access to the SSDs. In addition to the data storage capabilities provided by storage drives 120, chassis 100 may provide access to other storage resources that may be installed as components of chassis 100 and/or may be installed elsewhere within a rack housing the chassis 100, such as within a storage blade to which chassis 100 is coupled. In certain scenarios, such storage resources may be accessed via a SAS expander that is implemented by the motherboard sled 105. The SAS expander may support connections to a number of JBOD (Just a Bunch Of Disks) storage drives 120 that may be configured and managed individually and without implementing data redundancy across the various drives. The additional storage resources may also be at various other locations within a datacenter in which chassis 100 is installed. As described in additional detail below, storage drives 120 may be accessible via a PCIe switch fabric through a root complex that may be implemented by the CPU(s) of the motherboard sled 105, thus providing high-speed data storage capabilities to all components of chassis. Alternatively, embodiments support the root complex of the PCIe fabric being instead implemented by a hardware accelerator baseboard installed in a hardware accelerator sled 115, thus providing high-speed data storage capabilities directly to the one or more accelerator baseboards installed in the hardware accelerator sled 115.

As described, the chassis 100 of FIG. 1 includes a network controller 140 that provides network access to the motherboard sled 105 and, in some instances, to the hardware accelerator sled 115 installed within the chassis. Network controller 140 may include various switches, adapters, controllers and couplings used to connect chassis 100 to a network, either directly or via additional networking components and connections provided via a rack in which chassis 100 is installed, such as by a network switch installed in the chassis. As described in additional detail below, embodiments support a network controller 140 that is integrated along with PCIe switch 145 within a replaceable I/O module that may be installed within a 4 RU bay of chassis 100, and in particular within a front compartment of a processing layer of components installed in that bay of chassis 100. Embodiments also support configurations of chassis 100 where a network controller 140 is additionally included as an integrated component of a hardware accelerator baseboard installed in the hardware accelerator sled 115, thus providing high-speed network access directly to the one or more accelerator baseboards installed in the hardware accelerator sled 115.

Chassis 100 also includes a power supply unit 135 that provides the components of the chassis with various levels of DC power from an AC power source or from power delivered via a power system provided by a rack within which chassis 100 may be installed. In certain embodiments, power supply unit 135 may be implemented within one or more sleds that provide chassis 100 with redundant, hot-swappable power supply units. As described in additional detail below, power supply unit 135 may be a sled that installed within a 2 RU bay of chassis 100, and in particular within a rear compartment of a control layer of components installed in that bay of chassis 100.

As illustrated, chassis 100 includes cooling fans 130 that are utilized in the airflow cooling of the components installed in chassis 100. As described in additional detail below, cooling fans may include a replaceable bank of cooling fans that may be installed within a 4 RU bay of chassis 100, and in particular with a rear compartment of a processing layer of components installed in that bay of chassis 100. Installed in the manner the bank of cooling fans 130 provide cooling for the components installed within this 4 RU processing layer of chassis 100, and thus for the hardware accelerator sled 115. Through the illustrated configuration of chassis 100, the cooling requirements for hardware accelerator sled 115 may be met while utilizing a 4 RU bank of cooling fans 130 that is installed directly adjacent to the hardware accelerator sled 115. These cooling requirements may be further met by locating the power supply unit 135 and motherboard sled 105 within a separately-cooled bay of chassis 100 from the 4 RU processing layer in which the hardware accelerator sled 115 is installed.

Figure 2A:
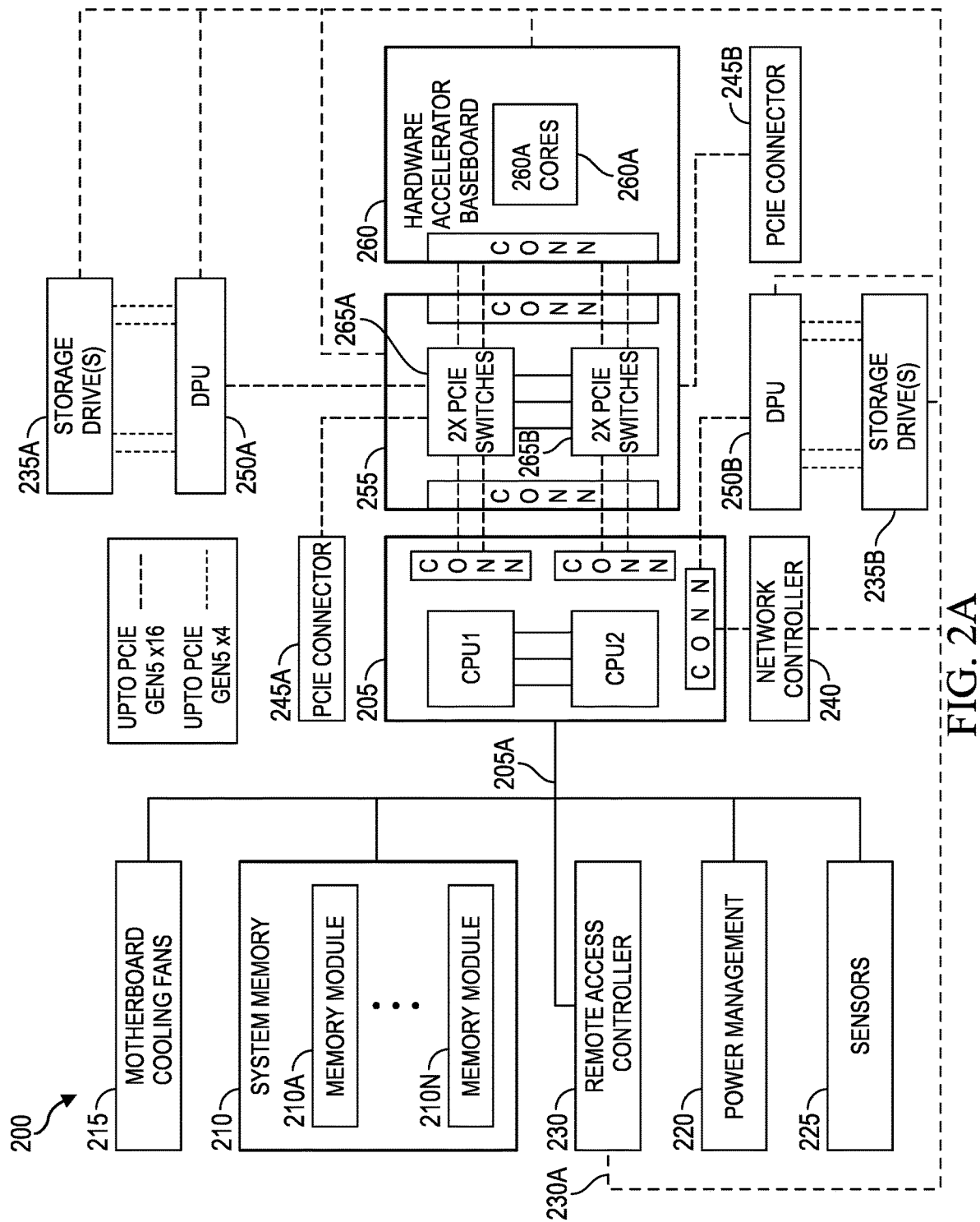
FIG. 2A is a circuit diagram illustrating certain components of an IHS, according to embodiments, that may be configured using an I/O module that supports use of a first replaceable hardware accelerator baseboard.
Figure 2B:
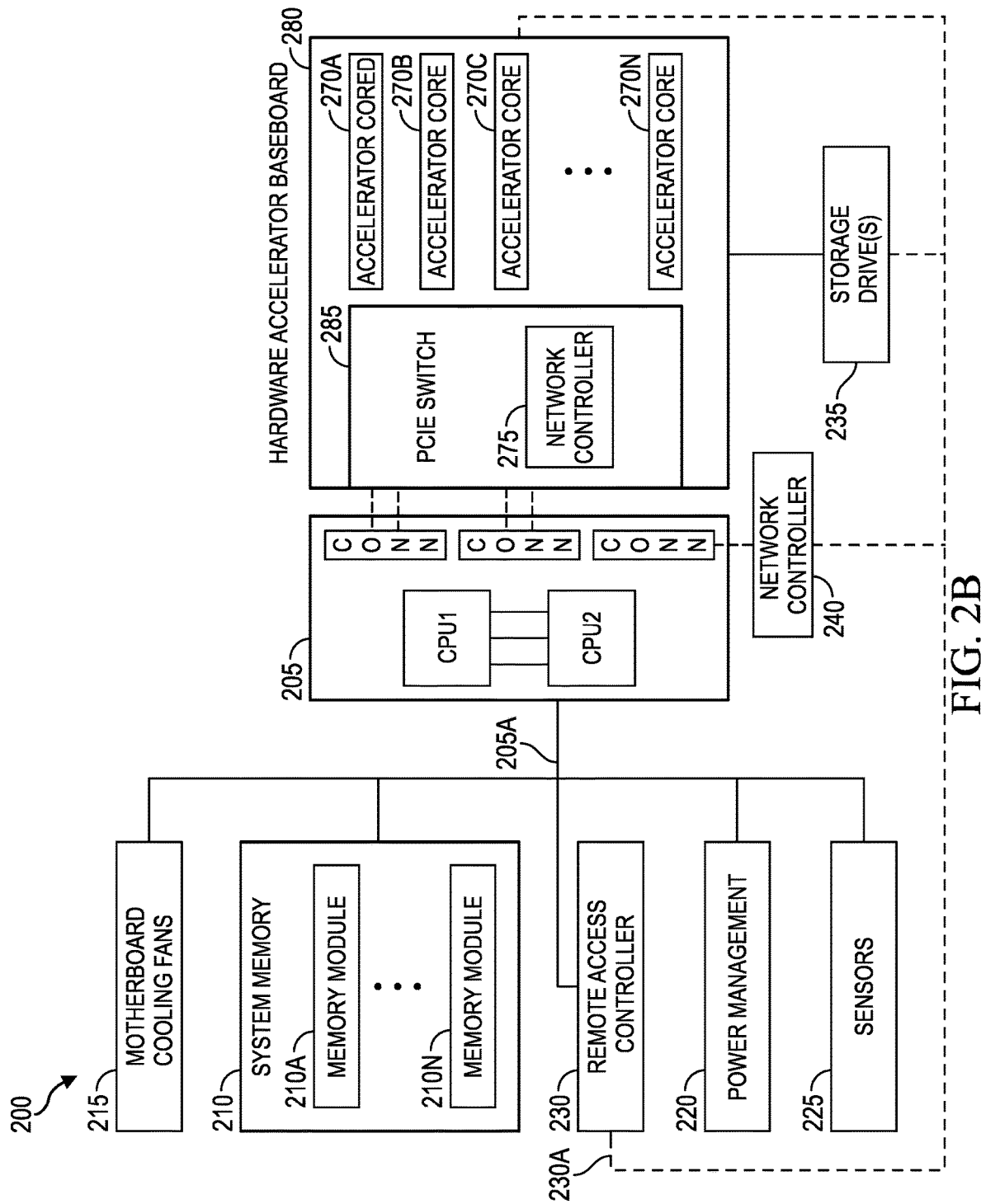
FIG. 2B is a circuit diagram illustrating certain components of the IHS of FIG. 2A reconfigured, according to some embodiments, using the I/O module that supports use of a second replaceable hardware accelerator baseboard.

FIGS. 2A and 2B are circuit diagrams illustrating certain components of an IHS 200, according to embodiments, that may be configured using an I/O module that supports use of a replaceable hardware accelerator baseboard. In FIG. 2A, IHS 200 is configured for operation of the root complex for the PCIe switch fabric of IHS 200 by the CPUs 205 of the IHS. In FIG. 2B, this same IHS 200 has been re-configured for operation of the root complex for the PCIe switch fabric of IHS 200 by a hardware accelerator baseboard 280 that includes integrated I/O capabilities. It should be appreciated that although the embodiments described herein may describe an IHS that is implemented using a motherboard sled 105 coupled to other components, such as hardware accelerator sled 115, that are deployed within the bays of a chassis, a variety of other types of IHSs may be implemented according to the embodiments described herein. In the illustrative embodiment of FIGS. 2A and 2B, IHS 200 may include a motherboard sled 105 installed in a 2 RU bay of a chassis 100, as well as components of a processing layer installed within a 4 RU bay the chassis 100. Once installed in the 6 RU chassis and coupled to each other, the electrical components of chassis 100 may be considered an IHS 200.

Accordingly, IHS 200 may utilize one or more system processors 205, that may be referred to as CPUs (central processing units) and that may be components of a motherboard sled 105. In some embodiments, CPUs 205 may each include a plurality of processing cores that may be separately assigned computing tasks. Each of the CPUs 205 may be individually designated as a main processor and as a co-processor, where such designations may be based on delegation of specific types of computational tasks to a CPU 205. In some embodiments, CPUs 205 may each include an integrated memory controller that may be implemented directly within the circuitry of each CPU 205. In some embodiments, a memory controller may be a separate integrated circuit that is located on the same die as the CPU 205. Each memory controller may be configured to manage the transfer of data to and from a system memory 210 of the IHS, in some cases using a high-speed memory interface. The system memory 210 is coupled to CPUs 205 via one or more memory buses that provide the CPUs 205 with high-speed memory used in the execution of computer program instructions by the CPUs 205. Accordingly, system memory 210 may include memory components, such as static RAM (SRAM), dynamic RAM (DRAM), NAND Flash memory, suitable for supporting high-speed memory operations by the CPUs 205. In certain embodiments, system memory 210 may combine persistent non-volatile memory and volatile memory.

In some embodiments, system memory 210 may be implemented, in part or in full, through DMA (Direct Memory Access) operations that are supported by SSD storage drives 235a-b that are accessible using PCIe NVMe. In configurations of IHS 200 as in FIG. 2A, where the root complex of the PCIe switch fabric is implemented by the CPUs 205, these DMA operations on SSD drives 235a-b may be supported through the use of PCIe links provided by a PCIe switches 265a-b, where these PCIe switches 265a-b may be a component of an integrated I/O module of the chassis. As illustrated in FIG. 2B, embodiments also support configurations of IHS 200 in which the root complex of the PCIe fabric is operated by the hardware accelerator baseboard 280. In such instances, system memory 210 that is usable by CPUs 205 in embodiments may include any SSDs that are accessible via the root complex that is supported by the integrated PCIe switch 275 of the hardware accelerator baseboard 280, where these SSDs may be accessed as system memory through DMA operations. Once configured as the root complex of the PCIe switch fabric of IHS 200, the hardware accelerator baseboard 280 with integrated I/O capabilities may also utilize DMA operations for accessing SSDs 235 that are included in the switch fabric of the IHS 200, including SSDs that are accessing using the PCIe switch of the integrated I/O module of the chassis.

In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket of a motherboard sled 105 that receives a removable memory module 210a-n, such as a DIMM (Dual In-line Memory Module), that can be coupled to the socket and then decoupled from the socket as needed, such as to upgrade memory capabilities or to replace faulty memory modules. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each CPU 205. All or portions of the chipset may be implemented directly within the integrated circuitry of an individual CPU 205. The chipset may provide the CPU 205 with access to a variety of resources accessible via one or more in-band buses 205a. IHS 200 may also include one or more I/O ports that may be used to couple the IHS 200 directly to other IHSs, storage resources, diagnostic tools, and/or other peripheral components. A variety of additional components may be coupled to CPUs 205 via a variety of busses. For instance, CPUs 205 may also be coupled to a power management unit 220 that may interface with a power system of the chassis 100 in which IHS 200 may be installed. CPUs 205 may collect information from one or more sensors 225 via a management bus.

In certain embodiments, IHS 200 may operate using a BIOS (Basic Input/Output System) that may be stored in a non-volatile memory accessible by the CPUs 205. The BIOS may provide an abstraction layer by which the operating system of the IHS 200 interfaces with hardware components of the IHS. Upon powering or restarting IHS 200, CPUs 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for execution by CPUs 205. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 230.

In some embodiments, IHS 200 may include a TPM (Trusted Platform Module) that may include various registers, such as platform configuration registers, and a secure storage, such as an NVRAM (Non-Volatile Random-Access Memory). The TPM may also include a cryptographic processor that supports various cryptographic capabilities. In IHS embodiments that include a TPM, a pre-boot process implemented by the TPM may utilize its cryptographic capabilities to calculate hash values that are based on software and/or firmware instructions utilized by certain core components of IHS, such as the BIOS and boot loader of IHS 200. These calculated hash values may then be compared against reference hash values that were previously stored in a secure non-volatile memory of the IHS, such as during factory provisioning of IHS 200. In this manner, a TPM may establish a root of trust that includes core components of IHS 200 that are validated as operating using instructions that originate from a trusted source.

As indicated in FIG. 2A, in some configurations of IHS 200, CPUs 205 may be coupled to a PCIe card 255 that includes two pairs of PCIe switches 265a-b (i.e., four distinct PCIe switches) that operate as I/O controllers for PCIe communications, such as TLPs (Transaction Layer Packets), that are transmitted between the CPUs 205 and PCIe devices and systems coupled to IHS 200. In some embodiments, each of the two pairs of PCIe switches 265a-b may be connected to the IHS via a removeable I/O module that is installed in a front compartment of a 4 RU processing layer of the chassis in which IHS 200 is installed. Whereas the illustrated configuration of FIG. 2A includes two CPUs 205 and two pairs of PCIe switches 265a-b, different embodiments may operate using different numbers of CPUs and PCIe switches. In addition to serving as I/O controllers that route PCIe traffic, the pairs of PCIe switches 265a-b include switching logic that can be used to expand the number of PCIe connections that are supported by CPUs 205. Accordingly, the pairs of PCIe switches 265a-b may multiply the number of PCIe lanes available to CPUs 205, thus allowing more PCIe devices to be connected to CPUs 205, and for the available PCIe bandwidth to be allocated with greater granularity.

In the configuration of IHS 200 in FIG. 2A, CPUs 205 utilize a PCIe switch fabric that includes each of the PCIe compliant devices of the IHS, such as PCIe switches 265a-b, SSD storage drives 235a-b, network controller 240 and a hardware accelerator baseboard 260. However, as indicated in FIG. 2B, embodiments also support capabilities by which the root complex of the PCIe switch fabric may be shifted from the CPUs 205 to a hardware accelerator baseboard 280 that includes integrated I/O capabilities, where these I/O capabilities include PCIe switch and network controller functions. The PCIe operations that are implemented by a CPU 205 according to embodiments are thus adapted to operate as the root complex of the PCIe switch fabric of IHS 200, as reflected in the configuration of FIG. 2A. And, as illustrated in FIG. 2B, when a hardware accelerator baseboard 280 has been detected that includes integrated I/O capabilities, the PCIe operations that are implemented by a CPU 205 according to embodiments are also adapted to operate as any other PCIe compliant device of IHS 200.

In the configuration of IHS 200 in FIG. 2A, CPUs 205 are coupled to a network controller 240, such as provided by a Network Interface Controller (NIC) card that provides IHS 200 with communications via one or more external networks, such as the Internet, a LAN, or a WAN. In some embodiments, network controller 240 may be support network operations by CPUs 205 through a PCIe coupling accessible by the chipsets of CPUs 205. As described in additional detail below, network controller 240 may be an integrated component of an I/O module that is located within the processing layer of the chassis, where this I/O module also includes one or more PCIe switch 255a-b. In such embodiments, integration of PCIe switch 265a-b and networking capabilities of network controller 240 within this I/O module supports PCIe network operations by CPUs and by one or more replaceable hardware accelerator baseboards 260, such as a GPU baseboard or a DPU baseboard, that are installed within a central compartment of the processing layer of the chassis in which IHS 100 is installed. In some embodiments, network controller 240 may support network operations by hardware accelerator baseboard 260 through reservation of available network bandwidth for exclusive use by this baseboard.

However, in the configuration of FIG. 2B, the hardware accelerator baseboard 280 includes an integrated network controller 275. Accordingly, in such configurations, the network controller 240 of the I/O module is still present, but is not utilized by the hardware accelerator baseboard 280. In embodiments, the network controller 240 of the I/O module thus does not reserve any network bandwidth for use by the hardware accelerator baseboard 280 such that the network controller 240 of the I/O module is used exclusively by the control layer of the chassis, and in particular by the motherboard of IHS 200.

In the configuration of FIG. 2A, PCIe switches 265a-b are coupled via PCIe connections to one or more hardware accelerator cores 260a that are connected to the IHS via one or more removeable hardware accelerator baseboards 260. Embodiments may include one or more hardware accelerator baseboards 260, such as a GPU baseboard, where each hardware accelerator baseboard 260 is coupled to one or more of the PCIe switches 265a-b, and where each hardware accelerator baseboard 260 may include one or more cores 260a. Each of the cores 260a may be a programmable processing core and/or hardware accelerator that can be configured for offloading certain functions from CPUs 205, or from a remote CPU. For instance, PCIe switches 265a-b may transfer instructions and data for generating video images between one or more cores 260a and CPUs 205. In processing this graphics data, cores 260a, each of which may be individual GPU cores, may include hardware-accelerated processing capabilities that are optimized for performing streaming calculation of vector data, matrix data and/or other graphics data, thus supporting the rendering of graphics for display on devices coupled either directly or indirectly to IHS 200.

Rather than being used for rendering graphics data for display, GPU cores 260a may instead be used in hardware-accelerated processing of graphics data for other purposes, such as in support of artificial intelligence and machine learning systems. For instance, GPU cores 260a may be used in processing graphical inputs from video and/or camera feeds being utilized in support of machine vision systems. In some instances, GPU cores 260a may process streaming video data in support of on-the-fly machine vision evaluation of live captured video, where captured video data and data resulting from the processing of the video data by the GPU cores 260a may be stored to SSD storage drives 235a-b via PCIe lanes implemented by PCIe switches 265a-b. In other instances, GPU cores 260a may be utilized in offline processing of video data, such as for training of machine learning systems. In such instances, the video data may be retrieved from SSD storage drives 235a-b and transmitted to GPU cores 260a for processing, also via PCIe lanes implemented by PCIe switches 265a-b. Embodiments may additionally or alternatively used in the offloading and acceleration of various types of computational workloads other than in the processing of video data, such as signal processing algorithms used in processing of speech data.

Rather than utilize GPUs for cores 260a, in some embodiments, the cores 260a of the hardware accelerator baseboard 260 may instead by DPU (Data Processing Unit) cores. In the same manner as a GPU baseboard, DPU baseboards may be installed within a hardware accelerator sled that is located within a central compartment of a 4 RU processing layer of a chassis 100. As with a GPU baseboard, a DPU hardware accelerator baseboard may provide hardware-accelerated computing in IHS 100, and may also provide optimized implementations for machine learning and other artificial intelligence calculations.

In the configuration of FIG. 2B, the hardware accelerator baseboard 280 includes an integrated PCIe switch 285 and network controller 285. As described, the coupling of such a baseboard 280 within a hardware accelerator sled 115 may be detected and utilized, upon initialization of IHS 200, to configure the hardware accelerator baseboard 280 as the root complex of the PCIe fabric of IHS 200. Configured in this manner, the hardware accelerator baseboard 280 may utilize the network controller 275 capabilities that are integrated into the PCIe switch 285 to gain high-speed and low-latency access to devices available via the PCIe switch fabric. For instance, hardware accelerator baseboard 280 may utilize DMA operations on SSD storage drives 2356 using PCIe NVMe links supported by the integrated I/O capabilities of the baseboard 280. As with the hardware accelerator baseboard 260 that does not include integrated I/O capabilities, the hardware accelerator baseboard 280 of FIG. 2B also includes accelerator cores 270*a-n* that may be tasked with offloaded computations, such as in support of machine learning and other artificial intelligence systems.

As described, IHS 200 may include a remote access controller 230 that supports remote management of IHS 200 and of various internal components of IHS 200. In certain embodiments, remote access controller 230 may operate from a different power plane from the CPUs 205 and from other components of IHS 200, thus allowing the remote access controller 230 to operate, and management tasks to proceed, while the processing cores of IHS 200 are powered off. As described, various functions provided by the BIOS, including launching the operating system of the IHS 200, may be implemented by the remote access controller 230. In some embodiments, the remote access controller 230 may perform various functions to verify the integrity of the IHS 200 and its hardware components prior to initialization of the operating system of IHS 200 (i.e., in a bare-metal state).

Remote access controller 230 may include a service processor, or specialized microcontroller, that operates management software that provides remote monitoring and administration of IHS 200. Remote access controller 230 may be installed on the motherboard of IHS 200, or may be coupled to IHS 200 via an expansion slot connector provided the IHS. In support of remote monitoring functions, remote access controller 230 may include a dedicated network adapter that may support management connections by remote access controller 230 using wired and/or wireless network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 230 may support monitoring and administration of various managed devices of an IHS via a sideband bus interface 230*a*. For instance, messages utilized in device management may be transmitted using I2C sideband bus 230*a* connections that may be established with each of the managed devices. These managed devices of IHS 200, such as specialized hardware, network controller(s) 240, hardware accelerator baseboard 260, hardware accelerator baseboard 280, and storage drives 235*a-b*, may be connected to the CPUs 205 via in-line buses, such as the described PCIe switch fabric, that is separate from the I2C sideband bus 230*a* connections used by the remote access controller 230 for device management. As described in additional detail with regard to FIG. 3, in some embodiments, remote access controller 230 may utilize this sideband bus 230*a* in identifying characteristics of a hardware accelerator baseboard that has been installed in IHS 200.

As described, a hardware accelerator sled may include multiple replaceable GPU baseboards and/or DPU baseboards that may be added and removed from the hardware accelerator sled. In support of this capability, remote access controller 230 may be configured to interface with the detected baseboards of a hardware accelerator sled 115 in order to determine whether a hardware accelerator baseboard that includes integrated I/O capabilities has been added or removed from the hardware accelerator sled. Based on this collected information, remote access controller 230 may notify CPUs 205 of the I/O capabilities of the detected hardware accelerator baseboard. In configurations such as FIG. 2A where the hardware accelerator baseboard 260 detected by the remote access controller 230 does not include integrated I/O capabilities, upon initialization of IHS 200, the CPU 205 is configured as the root complex of the PCIe fabric of IHS 200. In configurations such as FIG. 2B where the hardware accelerator baseboard 280 detected by the remote access controller 230 does include integrated I/O capabilities, upon initialization of IHS 200, the CPU 205 is configured as a PCIe endpoint and the hardware accelerator baseboard 280 is configured as the root complex of the PCIe fabric of IHS 200.

As indicated FIG. 2, IHS 200 includes a motherboard cooling fans 215. As described in additional detail below, the cooling capabilities provided by the block of cooling fans is dedicated for use by the cooling the components of the processing layer, especially hardware accelerator sled 115. As such, IHS 100 includes motherboard cooling fans 215 for use in providing airflow cooling to the control layer of the chassis, and in particular to the motherboard sled 105 and power supply units installed in the 2 RU control layer of the chassis. Through such allocation of airflow cooling resources within the described arrangement of chassis components, sufficient cooling is available to support high-performance computing implementations using the replaceable hardware accelerator sleds.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
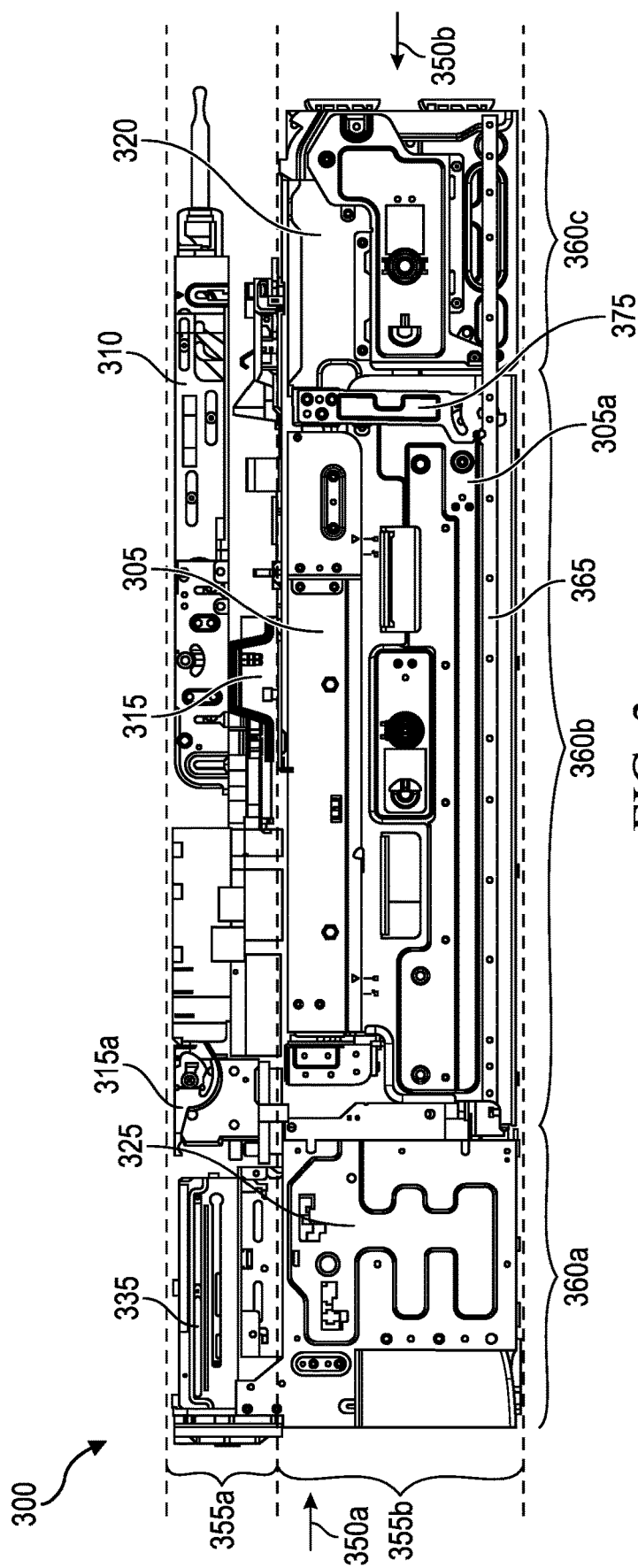
FIG. 3 is a cutaway sideview illustration of a chassis, according to embodiments, that may be reconfigured using an I/O module that supports use of replaceable hardware accelerator baseboards within the chassis.

FIG. 3 is a cutaway sideview illustration of a chassis, according to embodiments, that may be reconfigured using an I/O module that supports use of replaceable hardware accelerator baseboards within the chassis. In the illustrated embodiment, components installed in the chassis 300 may be serviced, added or replaced by a data center administrator via the front 350*a* side of the chassis, and via the rear 350*b* side of the chassis. In some instances, components installed in the chassis 300 may be accessed without removing the chassis from within the rack in which the chassis is installed. In other instances, the chassis 300 may be removed from the rack in order to access certain internal components of the chassis.

As indicated in FIG. 3, the chassis 300 is physically divided into two separate layers. A first layer is a control layer 355*a* that includes a motherboard 315 that provides computing resources used in the command and control of chassis 300. The control layer 355*a* also includes a power supply 310 that serves as a power source for all of the components of chassis 300. The second layer is a processing layer 355*b* that includes a replaceable hardware accelerator sled 305 that is located in a central compartment 360*b* of the processing layer. In the illustrated embodiment, the control layer 355*a* is the top layer of chassis 300 and processing layer 355*b* is the bottom layer of chassis 300. In other embodiments, the order of these two layers within chassis 300 may be reversed such that processing layer 355*b* is the top layer of chassis 300 and control layer 355*a* is the bottom layer of chassis 300.

Regardless of the ordering of the layers of chassis 300, in some embodiments, the processing layer 355*b* has a height of 4 RU and the control layer 355*a* has a height of 2 RU, such that the height of chassis 300 is 6 RU. In existing solutions that support replaceable hardware accelerators withing a chassis, such as replaceable GPUs, chassis heights are at least 8 RU, where this height is selected in order to support cooling of the replaceable hardware accelerators. Embodiments, on the other hand, support replaceable installation of hardware accelerator sled 305 within a 6 RU chassis, thus promoting denser arrangements of chassis within a rack.

In supporting high-density configurations that fit within 6 RUs, the 2 RU control layer 355a of chassis 300 includes the management and power capabilities of the chassis. In particular, the control layer 355a includes a motherboard 315 and one or power supply units 310. In some embodiments, motherboard 315 may be a component of a motherboard sled 105, such as described above, where this motherboard sled is inserted within the 2 RU processing layer 355b of chassis 300. Also include in the control layer 355a are one or more solid-state memory components 335 that may be used as storage class memories (SCMs) and/or system memories by motherboard 315. In some embodiments, motherboard 315 may also include a 2 RU motherboard fan 315a that provides airflow cooling to motherboard 315 and to the other components installed in the control layer 355a of chassis 300.

As described above, in some embodiments, the power supply units 310 may be replaceable components, such as a power supply sled, that may be inserted and removed by a data center administrator via the rear 350b of chassis 300. In some embodiments, power supply units 310 may be coupled to a power distribution board that may be a component of motherboard 315, or that may be a separate component installed within the control layer 355a between motherboard 315 and power supply 310. The power distribution board receives power inputs from the power supply units 310 and provides regulated power supplies to the components of the chassis, including the motherboard 315 in the control layer 355a of the chassis, as well as the components of the processing layer 355b of the chassis, including the I/O module 325, hardware accelerator sled 305 and cooling fans 320.

As described, processing layer 355b includes a replaceable hardware accelerator sled 305 that may include one or more hardware accelerator baseboards, such as the GPU baseboards and DPU baseboards described with regard to the IHS 200 of FIG. 2. In some embodiments, replaceable hardware accelerator sled 305 may include a PCB board with connectors, such as PCIe connectors, that receive PCB baseboards on which replaceable hardware accelerators are mounted. Once the hardware accelerator sled 305 has been removed from within the central compartment 360b of the processing layer 355b of the chassis 300, as described in additional detail below, individual replaceable hardware accelerator baseboards may be added and removed from the PCB board of the replaceable hardware accelerator sled 305.

The processors of the hardware accelerator sled 305 may be tasked by processes operating on a CPU of motherboard 315, or by processes operating on another chassis, that may or may not be within the same data center as chassis 300. In some instances, the processors of the replaceable hardware accelerator sled 305 may be utilized in machine learning and other artificial intelligence systems that are configured to distribute computing operations to available computing resources. In some instances, the processors of the replaceable hardware accelerator sled 305 may be configured especially for specific computing tasks, such as through the customization of programmable hardware accelerators of the hardware accelerator sled 305 for specific calculations.

At the front 350a of the processing layer 355b, embodiments may include a I/O module 325 that, as described above, includes an integrated network controller that provides network access to the motherboard 315, and in some instances, also provides network access to hardware accelerator sled 305. As described, embodiments support operation of the PCIe root complex by either the CPUs of the motherboard 315 or by a hardware accelerator baseboard that includes an integrated network controller and that is installed in the hardware accelerator sled 305 of the chassis. The network controller of the I/O module 325 allocates network bandwidth for use by the CPUs and by the hardware accelerator baseboards, where this bandwidth may be allocated based on the number and type of hardware accelerator baseboards installed in the hardware accelerator sled. In some embodiments, the I/O module 325 may allocate network controller bandwidth to a particular hardware accelerator baseboard commensurate with the PCIe bandwidth that has been allocated to that hardware accelerator baseboard. For instance, a hardware accelerator baseboard with four lanes of assigned PCIe bandwidth by the I/O module 325 will receive double the allocation of network controller bandwidth by the I/O module comparted to a hardware accelerator baseboard with two lanes of assigned PCIe bandwidth. However, in scenarios where the PCIe root complex is being operated by a hardware accelerator baseboard, the network controller of I/O module 325 is utilized strictly by the components of control layer 355a, with no allocation of bandwidth by the I/O module 325 for use by the hardware accelerator baseboards installed in the hardware accelerator sled 305.

Embodiments may also include a PCIe switch that is integrated in I/O module 325 that is located in processing layer 355b. In some embodiments, the PCIe switch of the I/O module 325 may include one or more PCB cards with connectors by which the hardware accelerator sled 305 is coupled to the PCIe switch. As illustrated, I/O module 325 may also include connectors by which motherboard 315 is coupled to the I/O module 325, and thus the integrated PCIe switch and network controller capabilities of the I/O module 325. In some embodiments, motherboard 315 may be coupled to I/O module 325 upon insertion of a motherboard sled 105 including motherboard 315 into the control layer 355a bay of the chassis 300, where the motherboard sled may be pushed into the control layer 355a bay of the chassis until PCIe connectors of the motherboard sled are coupled to connectors supported by the I/O module 325.

In some embodiments, the PCIe switch of I/O module 325 may include multiple PCIe connectors by which additional PCIe devices may be coupled to chassis 300. For instance, a structure supporting multiple drive bays may be attached to the front 350a of chassis. Each of these bays may support storage drives, such as an SSD (solid-state drive) supporting PCIe NVMe high-speed data interfaces, that are coupled to a PCIe connector supported by the PCIe switch of the I/O module 325. Once coupled to the PCIe connectors supported by the I/O module 325, these SSD drives may be accessed, throughout the root complex of the PCIe switch fabric of chassis 300. Like the integrated network controller of the I/O module 325, the integrated PCIe switch of the I/O module 325 is also configured to operate using a hardware accelerator baseboard installed in the hardware accelerator sled 305 as the root complex of the PCIe switch fabric, or using the CPUs of the motherboard 315 as the root complex.

Figure 4A:
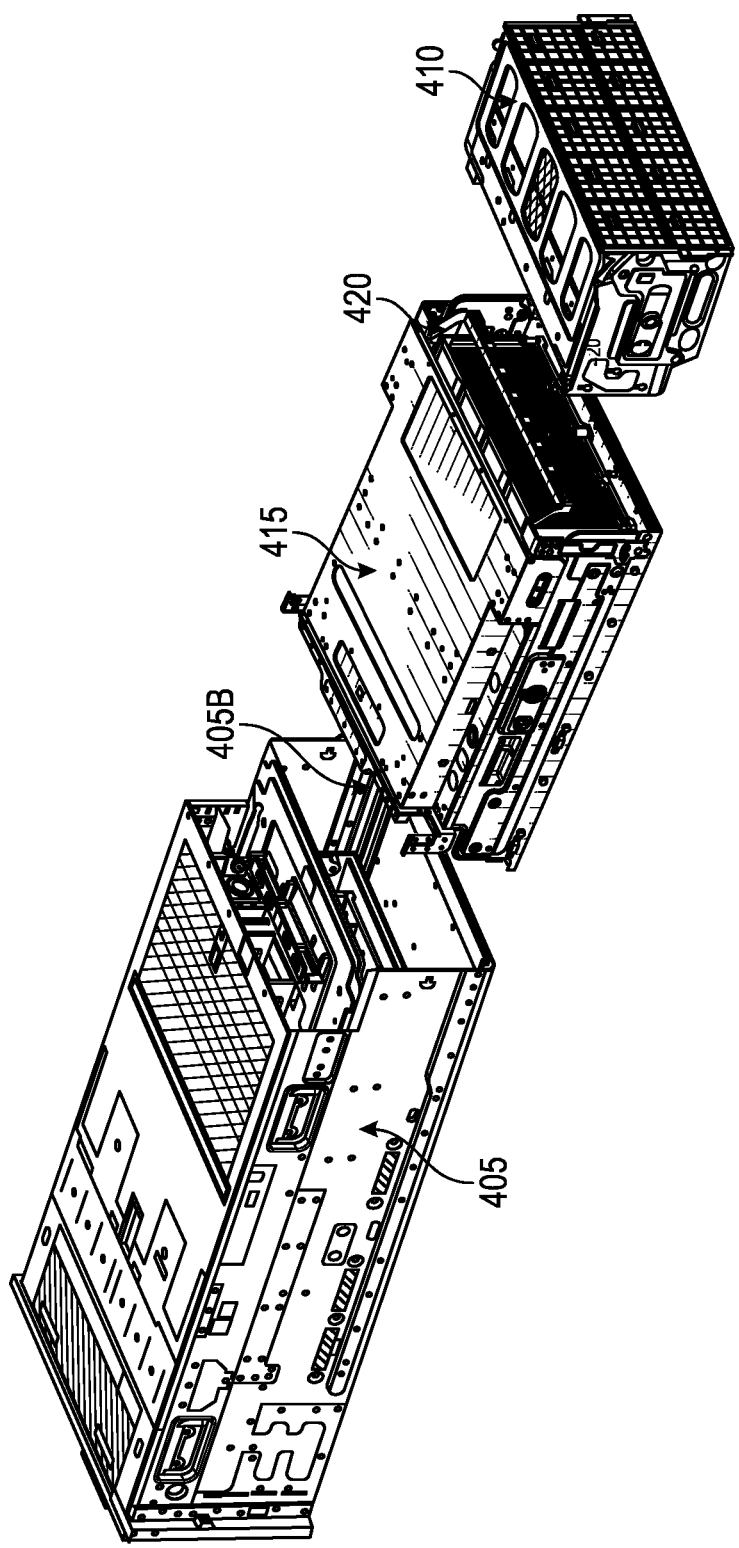
FIG. 4A is an illustration of the removal of components of a processing layer of a reconfigurable chassis, according to embodiments.
Figure 4B:
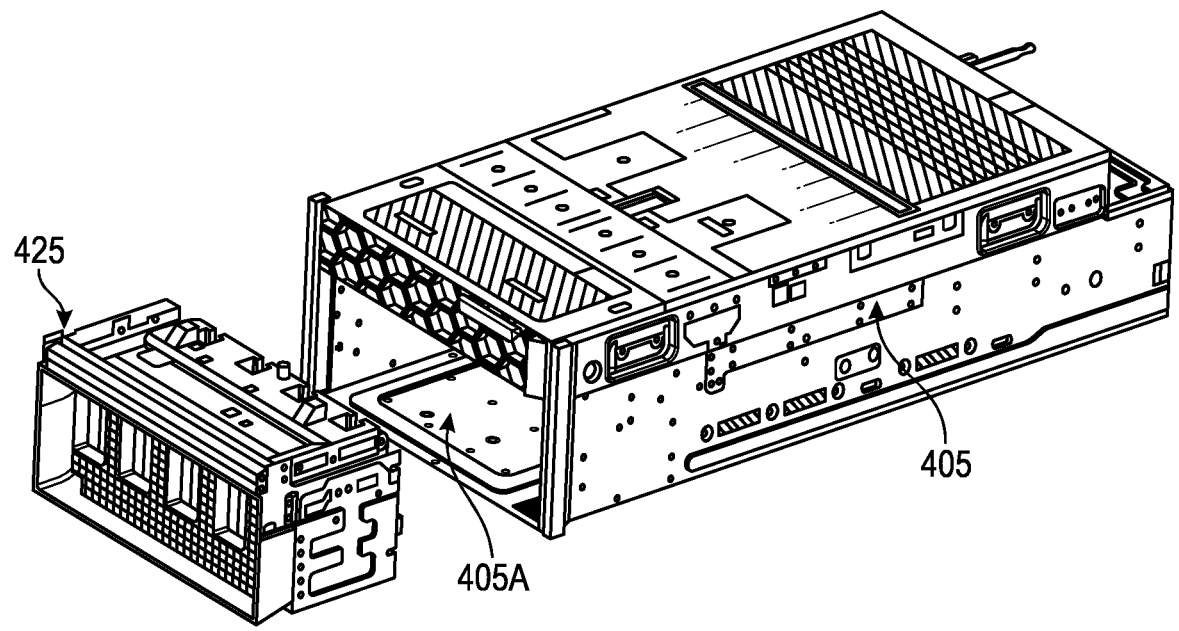
FIG. 4B is an additional illustration of the removal of components of a processing layer of a reconfigurable chassis, according to embodiments.

As described, data center administrators may be tasked with adding, removing or otherwise servicing components of chassis 300. Accordingly, as illustrated in FIG. 4B, embodiments support the ability for the I/O module 425 including the integrated network controller and PCIe switch to be removed via the front compartment 405*a* of chassis 405. For instance, a data center administrator may decouple I/O module 425 from the hardware accelerator sled 405 (and in some cases, also from the motherboard sled) in order to then pull the I/O module 425 outwards via an opening in the front compartment 405*a* of chassis 405. In this manner, the integrated PCIe switch and network controller of the I/O module 425 remain coupled to each other while a data center administrator as a unitary module that can be separately replaced in chassis 405.

As illustrated in FIG. 3, a bank of 4 RU cooling fans 320 is located in the rear compartment 360*c* of chassis 300. Through use of these particular cooling fans 320 in this location, embodiments provide sufficient cooling in this arrangement of components within the processing layer 355*b* of chassis 300. In addition, as illustrated in FIG. 4A, the bank of cooling fans 410 may be removed from chassis 405 by an administrator, along with the hardware accelerator sled 415, by removing them from the rear opening of chassis 405. In this optimal arrangement of components within chassis 300, the replaceable hardware accelerator sled 305 is located within a central compartment 360*b* of the processing layer 355*b*. However, as described, hardware accelerator capabilities of a chassis 300 may be modified for various reasons, such as to customize the computational capabilities of the chassis to a specific set of computational tasks, or such as in response to a change in ownership or leasing of chassis 300. Accordingly, datacenter administrators may occasionally access and replace the hardware accelerator sled 305.

In support of the ability to quickly remove hardware accelerator sled 305 from within the central compartment 360*b* of the processing layer 355*b*, the hardware accelerator sled 305 may include a handle 375 that may be used by the data center administrator to pull the hardware accelerator sled 305 out of the processing layer bay of the chassis 300. In FIG. 3, the handle 375 of the hardware accelerator sled 305 is in a stored position, thus allowing the bank of cooling fans 320 to be installed directly adjacent to the hardware accelerator sled 305 and maximizing use of space within the processing layer 355*b* of high-density chassis 300. As illustrated in FIG. 4A, the handle 420 is rotated to a deployed position allowing an administrator to pull the hardware accelerator sled 305 from within the central compartment 360*b*. Once servicing of the hardware accelerator sled 305 has been completed, the administrator aligns rails 305*a* on each side of the sled 305 with corresponding rails 405*b* on each inner wall of the chassis 405. Aligned on corresponding rails 305*a* and 405*b*, the administrator uses handle 420 to push the hardware accelerator sled 305 back into the central compartment 360*b* such that the connectors of the hardware accelerator sled 305 are aligned with connectors of the I/O module 325.

In FIG. 4A, the data center administrator has decoupled the bank of cooling fans 410 from the hardware accelerator sled 415 and has also pulled the hardware accelerator sled 415 from within the processing layer of chassis 405. First, the administrator decouples the 2 RU bank of fans 410 from the hardware accelerator sled 415, leaving hardware accelerator sled 415 within the processing layer 355*b* of the chassis 405. Once decoupled, the bank of fans 410 may be pulled outward from the rear compartment of the chassis by the administrator. The handle 420 of the hardware accelerator sled 415 may then be used by the administrator pull the hardware accelerator sled 415 out from the chassis 405.

Once removed from chassis 405, an administrator may replace the hardware accelerator sled 415 with another sled that is compatible with embodiments of the configurable chassis 405. In other instances, the administrator may open hardware accelerator sled 415 and service the hardware accelerator baseboards installed within the sled. The new or serviced hardware accelerator sled 415 may then be re-inserted into the central compartment of the processing layer of chassis 405. In some scenarios, an administrator may add or remove a hardware accelerator baseboard that includes integrated I/O capabilities, such as described above, that support operation of the root complex of the PCIe fabric of chassis 405 by the hardware accelerator baseboard. When a hardware accelerator baseboard with these capabilities is added or removed, reinstalling hardware accelerator sled 415 into chassis 405 may result in the remote access controller of the motherboard that is installed in the control layer of chassis 405 detecting the addition or removal of this hardware accelerator baseboard with integrated I/O capabilities. This detected change in hardware accelerator baseboards is then reported to the CPU of the motherboard for reconfiguration of the CPU as the root complex or as an end point of the PCIe switch fabric of chassis 405. Based on the I/O capabilities of the hardware accelerator baseboards detected in the hardware accelerator sled 415, the remote access controller may notify the I/O module 425 of the detected I/O capabilities of the baseboards. In response, the I/O module 425 modifies the allocation of PCIe bandwidth and network controller bandwidth for each of the detected hardware accelerator baseboards.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains"

one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis housing an Information Handling System (IHS), the chassis comprising:
   a motherboard comprising one or more CPUs (Central Processing Units) configured to operate as a root complex for a PCIe switch fabric comprising a plurality of PCIe devices of the IHS; and
   an I/O module providing I/O capabilities for the motherboard, wherein the I/O module comprises:
     a network controller configured to allocate network bandwidth for use by a hardware accelerator sled installed in the chassis, unless an integrated network controller is detected as a component of a hardware accelerator baseboard installed in the hardware accelerator sled, and
     a PCIe switch that operates with the CPUs as the root complex of the PCIe switch fabric and with the hardware accelerator baseboard as a PCIe endpoint of the PCIe switch fabric, and wherein the PCIe switch operates with the CPUs as PCIe endpoints of the PCIe switch fabric and the hardware accelerator baseboard as the root complex of the PCIe switch fabric.

2. The chassis of claim 1, further comprising a 2 RU (Rack Unit) control layer, wherein the control layer comprises:
   the motherboard; and
   a power supply for use by components installed in the control layer of the chassis and for use by components installed in a 4 RU processing layer of the chassis.

3. The chassis of claim 2, further comprising the processing layer, wherein the processing layer comprises: the I/O module and the hardware accelerator baseboard.

4. The chassis of claim 3, wherein a height of the chassis is 6 RU.

5. The chassis of claim 3, wherein the I/O module is replaceable via a front compartment of the processing layer of the chassis.

6. The chassis of claim 1, further comprising the hardware accelerator sled installed in a bay of the chassis, where the hardware accelerator sled comprises the hardware accelerator baseboard.

7. The chassis of claim 1, wherein the hardware accelerator sled comprises a plurality of GPU (Graphics Processing Unit) baseboards and wherein the hardware accelerator baseboard comprises a first of the GPU baseboards.

8. The chassis of claim 1, wherein the plurality of PCIe devices comprise a plurality of SSDs (Solid State Drives).

9. The chassis of claim 8, wherein, when the CPUs are the root complex of the PCIe switch fabric, DMA (Direct Memory Access) on the SSDs is provided by the PCIe switch of the I/O module.

10. The chassis of claim 9, wherein, when the hardware accelerator baseboard is the root complex of the PCIe switch fabric, DMA on the SSDs is provided by a PCIe switch of the hardware accelerator baseboard.

11. An Information Handling System (IHS) installed in a chassis, the IHS comprising:
    a motherboard comprising one or more CPUs (Central Processing Units) configured to operate as a root complex for a PCIe switch fabric comprising a plurality of PCIe devices of the IHS; and
    an I/O module providing I/O capabilities for the motherboard, wherein the I/O module comprises:
      a network controller configured to allocate network bandwidth for use by a hardware accelerator sled installed in the chassis, unless an integrated network controller is detected as a component of a hardware accelerator baseboard installed in the hardware accelerator sled, and
      a PCIe switch that operates with the CPUs as the root complex of the PCIe switch fabric and with the hardware accelerator baseboard as a PCIe endpoint of the PCIe switch fabric, and wherein the PCIe switch operates with the CPUs as PCIe endpoints of the PCIe switch fabric and the hardware accelerator baseboard as the root complex of the PCIe switch fabric.

12. The IHS of claim 11, wherein the I/O module is replaceable via a front compartment of the processing layer of the chassis.

13. The IHS of claim 11, further comprising the hardware accelerator sled installed in a bay of the chassis, where the hardware accelerator sled comprises the hardware accelerator baseboard.

14. The IHS of claim 11, wherein the hardware accelerator sled comprises a plurality of GPU (Graphics Processing Unit) baseboards and wherein the hardware accelerator baseboard comprises a first of the GPU baseboards.

15. The IHS of claim 11, wherein the plurality of PCIe devices comprise a plurality of SSDs (Solid State Drives).

16. A system comprising:
    a motherboard comprising one or more CPUs (Central Processing Units) configured to operate as a root complex for a PCIe switch fabric comprising a plurality of PCIe devices of the IHS; and
    an I/O module providing I/O capabilities for the motherboard, wherein the I/O module comprises:
      a network controller configured to allocate network bandwidth for use by a hardware accelerator sled installed in the chassis, unless an integrated network controller is detected as a component of a hardware accelerator baseboard installed in the hardware accelerator sled, and
      a PCIe switch that operates with the CPUs as the root complex of the PCIe switch fabric and with the hardware accelerator baseboard as a PCIe endpoint of the PCIe switch fabric, and wherein the PCIe switch operates with the CPUs as PCIe endpoints of the PCIe switch fabric and the hardware accelerator baseboard as the root complex of the PCIe switch fabric.

17. The system of claim 16, wherein the I/O module is replaceable via a front compartment of the processing layer of the chassis.

18. The system of claim 16, further comprising the hardware accelerator sled installed in a bay of the chassis, where the hardware accelerator sled comprises the hardware accelerator baseboard.

19. The system of claim 16, wherein the hardware accelerator sled comprises a plurality of GPU (Graphics Processing Unit) baseboards and wherein the hardware accelerator baseboard comprises a first of the GPU baseboards.

20. The system of claim 16, wherein the plurality of PCIe devices comprise a plurality of SSDs (Solid State Drives).

* * * * *